United States Patent
Arima

(10) Patent No.: US 6,972,591 B2
(45) Date of Patent: Dec. 6, 2005

(54) SEMICONDUCTOR INTEGRATED CIRCUIT DEVICE HAVING A SEMICONDUCTOR DEVICE WITH A MODULATABLE GAIN COEFFICIENT

(75) Inventor: Yutaka Arima, Iizuka (JP)

(73) Assignee: Exploitation of Next Generation Co., Ltd., Fukuoka (JP)

(*) Notice: Subject to any disclaimer, the term of this patent is extended or adjusted under 35 U.S.C. 154(b) by 0 days.

(21) Appl. No.: 10/404,431

(22) Filed: Apr. 2, 2003

(65) Prior Publication Data

US 2003/0189442 A1  Oct. 9, 2003

(30) Foreign Application Priority Data

Apr. 3, 2002  (JP) .............................. 2002-137800

(51) Int. Cl.$^7$ ......................................... H03K 19/173
(52) U.S. Cl. ......................................... 326/38; 328/41
(58) Field of Search .......................... 326/83, 38, 26, 326/86, 87, 93; 330/254; 327/359; 331/57, 331/108, 117

(56) References Cited

U.S. PATENT DOCUMENTS

| | | | | |
|---|---|---|---|---|
| 3,851,189 A | * | 11/1974 | Moyer | 327/210 |
| 5,001,372 A | * | 3/1991 | Nyqvist | 327/113 |
| 5,539,196 A | * | 7/1996 | Miyawaki et al. | 250/208.1 |
| 6,100,760 A | * | 8/2000 | Maruyama et al. | 330/254 |
| 6,509,796 B2 | * | 1/2003 | Nguyen et al. | 330/254 |
| 6,526,680 B1 | * | 3/2003 | Yu | 40/204 |
| 6,597,199 B1 | * | 7/2003 | Bui | 326/83 |
| 6,774,733 B2 | * | 8/2004 | Arima | 331/57 |
| 6,815,765 B2 | * | 11/2004 | Arima | 257/327 |

FOREIGN PATENT DOCUMENTS

WO  WO 02/059979 A1  8/2002

OTHER PUBLICATIONS

Arima, Y., "Frequency Variable Oscillation Circuit", U.S. Appl. No. 10/302,880, filed Nov. 25, 2002.

* cited by examiner

Primary Examiner—Lam T. Mai
(74) Attorney, Agent, or Firm—Finnegan, Henderson, Farabow, Garrett & Dunner, LLP

(57) ABSTRACT

An inverter circuit which is a representative example of the logic circuit includes a p-channel A-MOS transistor and an n-channel transistor. The gain coefficient β of the p-channel A-MOS transistor and n-channel transistor changes according to a voltage on a control gate. The control gate of the p-channel A-MOS transistor and n-channel MOS transistor is connected to an output node of the inverter circuit, and the normal MOS gate is connected to an input node of the inverter circuit. Thus, the ON resistance of the p-channel A-MOS transistor and n-channel transistor is automatically modulated to decrease as the source-drain voltage increases.

12 Claims, 8 Drawing Sheets p-ch n-ch

SEMICONDUCTOR INTEGRATED CIRCUIT DEVICE HAVING A SEMICONDUCTOR DEVICE WITH A MODULATABLE GAIN COEFFICIENT

BACKGROUND OF THE INVENTION

1. Field of the Invention

The present invention relates to a logic circuit configuration in a semiconductor integrated circuit device. A semiconductor integrated circuit technique according to the present invention is particularly expected to be used for an LSI having an operating frequency higher than 10 GHz.

2. Description of the Background Art

With considerable improvements in LSI manufacturing technique, devices and signal interconnections are increasingly reduced in size. Accordingly, more complicated design optimizations are required for the system LSI in order to integrate various types of functional blocks onto one chip. Most of system LSIs each have the bulk part constituted of CMOS logic circuits. A CMOS logic gate produced by a process technique achieving the minimum line width of approximately 0.18 $\mu$m, which is the level in the current mass production, is usually capable of transmitting a signal accompanied by a delay time of approximately a few hundreds of ps. In other words, the recent LSI achieves an operating frequency of several GHz.

In order to allow the LSI to actually operate at several GHz, however, a careful design is necessary. One reason for this is that, as the device size is increasingly reduced, the parasitic inductance of the interconnection is becoming a factor which cannot be neglected. Usually, a delay time due to the parasitic inductance of the interconnection is, at most, approximately a few tens of ps. Such an extent of delay time has been ignorable, as compared with the gate delay time. However, when the operating frequency is several GHz or higher, a tolerable delay time between gates is 100 ps or shorter. Then, the delay time due to the parasitic inductance of the interconnection cannot be ignored.

FIG. 13 exemplarily shows a general circuit configuration of a conventional CMOS inverter. C and L in FIG. 13 respectively represent load capacitance and parasitic inductance of the interconnection. Actually, parasitic capacitances and parasitic resistances are distributively present along the interconnection. For the purpose of simplifying illustration, however, it is supposed here that the parasitic capacitance is included in the load capacitance and the parasitic resistance is included in an ON resistance R of a transistor. FIG. 14 exemplarily shows a change with time of an output signal with respect to an input signal of the circuit shown in FIG. 13. The example shown in FIG. 14 illustrates damped oscillation of the output signal. The oscillation phenomenon of the output signal generally occurs when a circuit parameter satisfies a condition of $R<(4L/C)^{0.5}$, and the damping time constant $\tau$ of the damped oscillation is $2L/R$. In general, a metal interconnection within an LSI has a parasitic inductance of approximately 0.3 to 1 nH when the length of the interconnection is approximately 1 mm. Then, if a transistor has an ON resistance of 100 $\Omega$, the delay time caused by this oscillation phenomenon is estimated at approximately 6 to 20 ps. Such an extent of the delay time cannot be ignored for the LSI operating at a frequency of several GHz.

FIG. 15 shows a relation between an ON resistance of a transistor and a delay time, for each of the delay time due to the load capacitance and the delay time caused by the oscillation phenomenon due to the parasitic inductance. The solid lines show a characteristic which increases in proportion to the ON resistance and represent the delay time determined by an RC time constant depending on load capacitance C, and the inclination of the solid lines becomes steeper as C increases. On the other hand, the dotted lines show a characteristic which is proportional to the reciprocal of the ON resistance and represent the delay time determined by a time constant $2L/R$ depending on inductance L. As seen from FIG. 15, the optimum value of the ON resistance of a transistor for minimizing the delay time varies depending on load capacitance C and inductance L. Optimization of the ON resistance refers to design of the size (ratio of gate length to gate width) of the transistor. A difficult issue here is that the delay time cannot be decreased merely by increasing the transistor size when the delay effect due to inductance L is a factor which cannot be ignored. In other words, a problem occurs that the delay due to the inductance increases even if the transistor size is increased to achieve decrease of the delay time relevant to the load capacitance, as shown in FIG. 16.

As seen from FIGS. 15 and 16, in order to minimize the delay time, the transistor size must be determined for each of load capacitance C and inductance L. Even if the transistor size is optimized, a problem remains that the minimum delay time increases as C or L increases. This means that C and L must be set at a certain value or less for speedup of the LSI, which imposes a considerable limit on the design of the LSI having a tendency to have a longer interconnection length and a greater load capacitance. In order to overcome this limit, it is necessary to decrease load capacitance C by designing the LSI to provide a plurality of drivers and accordingly disperse loads, or provide a relay driver at any place on the long interconnection, for example.

Such measures for overcoming the limit would suffer considerable penalties in power consumption and circuit area. In other words, in order to allow the speedup and the increase in scale of the LSI to be compatible with each other in the future, the issue of the delay time due to the parasitic inductance of the interconnection must be solved. The present invention thus aims to lessen influences of the parasitic inductance.

SUMMARY OF THE INVENTION

One object of the present invention is to provide a semiconductor integrated circuit device having a short signal delay even if its signal interconnection is longer, by decreasing the signal delay time resultant from signal oscillation due to a parasitic inductance of the interconnection.

According to one configuration of the present invention, a semiconductor integrated circuit device includes a semiconductor logic circuit, the semiconductor logic circuit including a semiconductor device having a gain coefficient which is electrically modulatable in analogue manner.

Preferably, the semiconductor device is a field-effect transistor, and the gain coefficient of the field-effect transistor is modulated according to a voltage between the source and drain of the field-effect transistor.

Still preferably, the semiconductor device is a field-effect transistor, and the gain coefficient of the field-effect transistor decreases with decrease of a voltage between the source and drain of the field-effect transistor.

Still preferably, the semiconductor device has a p-type MOS device with modulatable gain coefficient and an n-type MOS device with modulatable gain coefficient, and at least one of the p-type MOS device with modulatable gain coefficient and the n-type MOS device with modulatable gain coefficient has its control gate connected to an output node of the semiconductor logic circuit.

According to another configuration of the present invention, a semiconductor integrated circuit device includes a logic circuit providing, according to a result of a predetermined logical operation performed on an input which is at least one signal having one of a first level and a second level, one of the first level and the second level, to an output node. The logic circuit includes a first field-effect transistor having a gain coefficient electrically modulatable in analogue manner, and the first field-effect transistor has a gate electrically connected between a first voltage corresponding to the first level and the output node and receiving one of (i) one of the at least one signal and (ii) a signal according to the at least one signal, transmitted to the gate.

Preferably, the gain coefficient of the first field-effect transistor changes according to a voltage between the source and drain of the first field-effect transistor.

Still preferably, the gain coefficient of the first field-effect transistor decreases with decrease of the voltage between the source and drain.

Still preferably, the first field-effect transistor further has a control gate electrically connected to the output node, and the gain coefficient of the first field-effect transistor continuously changes according to a voltage applied to the control gate.

Still preferably, the logic circuit further includes a second field-effect transistor having a gain coefficient electrically modulatable in analogue manner and having a conductivity type opposite to that of the first field-effect transistor, and the second field-effect transistor has a gate electrically connected between a second voltage corresponding to the second level and the output node and receiving one of (i) one of the at least one signal and (ii) a signal according to the at least one signal, transmitted to the gate.

Still preferably, the first and second field-effect transistors each further have a control gate, respective gain coefficients of the first and second field-effect transistors continuously change according to voltages respectively applied to respective control gates of the first and second field-effect transistors, and at least one of respective control gates of the first and second field-effect transistors is electrically connected to the output node.

A chief advantage of the present invention is prevention of increase of the signal delay time which is caused by the signal oscillation due to the parasitic inductance of the interconnection of the semiconductor integrated circuit. Accordingly, the semiconductor integrated circuit of the present invention can be employed to remarkably shorten the signal delay even if an LSI has a longer signal interconnection and thus achieve a fast operation of the LSI. The semiconductor integrated circuit technique of the present invention is particularly effective for an LSI having an operating frequency of 10 GHz or higher.

The conventional CMOS logic circuit has a problem of increase in power consumption resultant from increase of current flowing through a transistor which is to be turned off, as the operating speed of the logic circuit is enhanced. On the other hand, the circuit configuration of an A-MOS according to the present invention provides an effect that, even if the logic circuit operates at a higher speed, increase in power consumption of the LSI due to the speedup is prevented by decreasing the current flowing through the transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the present invention is now described in detail with reference to the drawings. In the following embodiment, a MOS transistor is described as one representative example of the field effect transistor.

Figure 1:
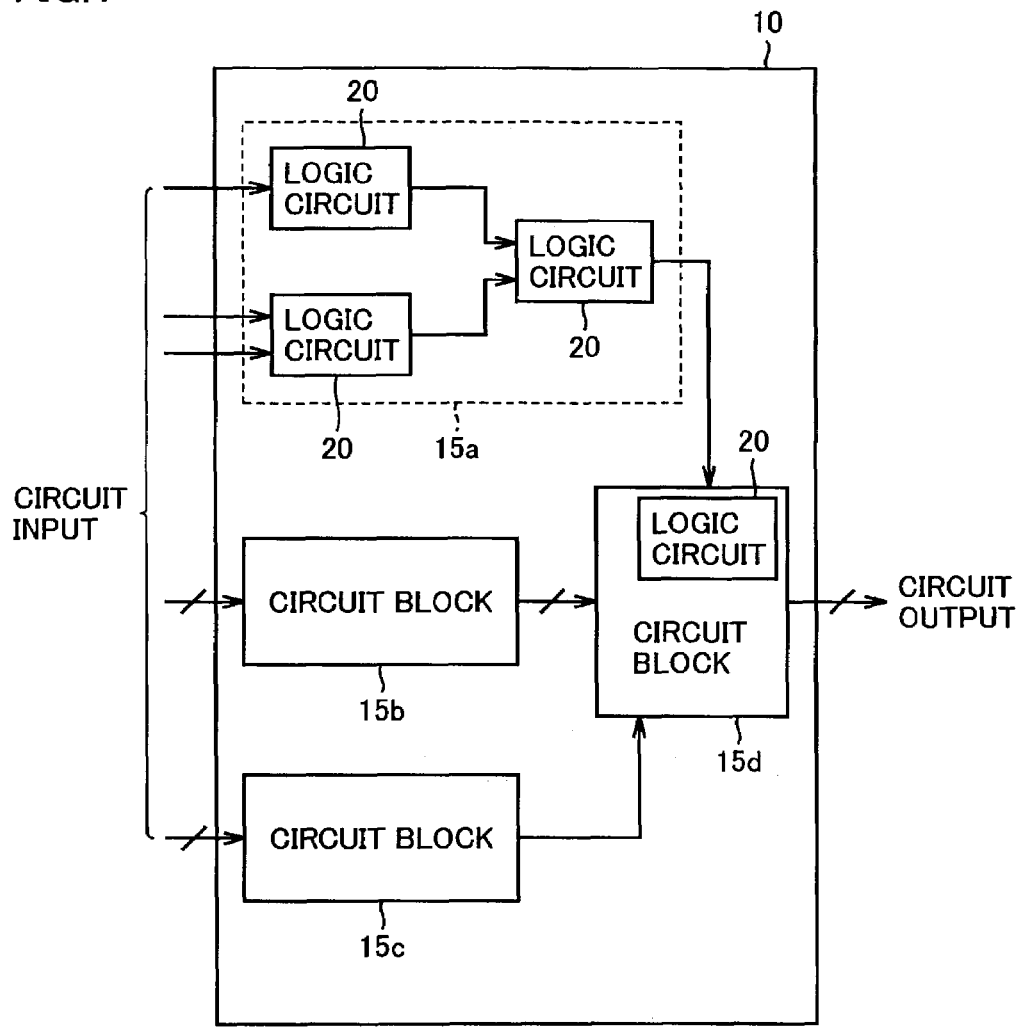
FIG. 1 is a block diagram showing an exemplary configuration of a semiconductor integrated circuit device according to the present invention.

Referring to FIG. 1, a semiconductor integrated circuit device 10 according to the present invention includes a plurality of circuit blocks 15a–15d each carrying out a predetermined operation. These circuit blocks are usually connected to each other to operate in cooperation. In the example shown in FIG. 1, circuit block 15d operates according to results of processing of respective circuit inputs in circuit blocks 15a–15c so as to provide a desired circuit output.

Circuit block 15a is shown as a logic circuit block performing a predetermined logical operation on its circuit inputs. Circuit block 15a includes a plurality of combined logic circuits 20. Logic circuits 20 each output a result of a predetermined logical operation (e.g. NOT, NAND, AND, OR) performed on at least one input signal having one of the logic high level (hereinafter referred to as "H level") and the logic low level (hereinafter referred to as "L level"). Logic circuits 20 may be provided not only in such a logic circuit block dedicated to the logical operation but also in any of other circuit blocks.

As clearly seen from the following description of this embodiment according to the present invention, the logic circuit in the semiconductor integrated circuit device is configured by employing a field-effect transistor with a gain coefficient β which can be modulated (may hereinafter be referred to as "β-variable MOS transistor"). Specifically, instead of n-channel and p-channel MOS transistors in a conventional C-MOS logic circuit, n-channel and p-channel β-variable MOS transistors are employed.

Figure 2A:
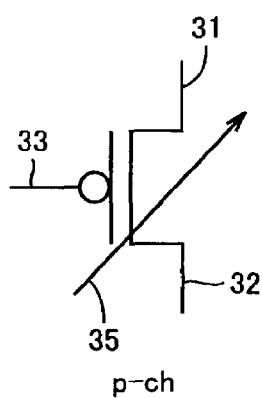
FIGS. 2A and 2B each show a symbol for a MOS transistor with variable gain coefficient $\beta$ according to one embodiment.
Figure 2B:
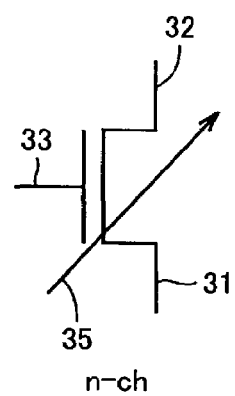

As shown in FIGS. 2A and 2B, the β-variable MOS transistor is represented by the symbol for the conventional MOS transistor (field-effect transistor) including a source 31, a drain 32 and a gate 33 to which a control gate 35 indicated by the oblique arrow is added. According to an input to control gate 35 (e.g. applied voltage), gain coefficient β of the β-variable MOS transistor is modulated in analog manner. As the conventional MOS transistor, the β-variable MOS transistor includes two types of transistors, i.e., p-channel transistor (FIG. 2A) and n-channel transistor (FIG. 2B).

According to this embodiment, as a representative example of the β-variable MOS transistor, an A-MOS device (Adjustable β-MOS) is used. Details of the A-MOS device are disclosed in International Publication No. WO02/059979A1. It is noted here that, for the present invention, devices other than the A-MOS device can also be used as a β-variable MOS transistor.

A configuration and characteristics of the A-MOS device are described briefly below.

Figure 3:
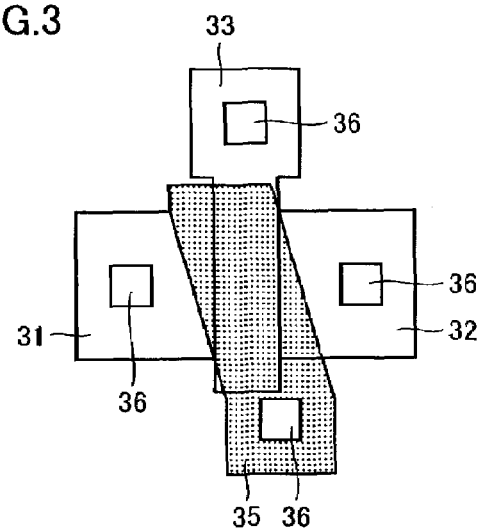
FIG. 3 shows an exemplary configuration of the MOS transistor with variable gain coefficient $\beta$.

Referring to FIG. 3, the A-MOS device includes a control gate 35, in addition to a source 31, a drain 32 and a gate 33 of a normal MOS transistor (may hereinafter be referred to as "normal MOS gate"). Contacts 36 are appropriately provided to source 31, drain 32, normal MOS gate 33 and control gate 35. For example, control gate 35 is disposed at a predetermined angle with respect to normal MOS gate 33. In this case, control gate 35 may be formed by using a layer different from that of normal MOS gate 33 so as to overlap normal MOS gate 33. Moreover, the channel portion under control gate 35 (hereinafter "control gate channel") is designed so that the impurity concentration of this channel portion is different from the impurity concentration of the channel portion under normal MOS gate 33 (hereinafter "MOS gate channel"). Then, respective channel conductances of the control gate channel and the MOS gate channel are adjustable independently of each other. As shown in the exemplary configuration, the A-MOS device has a basic configuration characterized by that substantially triangular control gate channels each located between normal MOS gate 33 and source 31/drain 32 are formed with the normal MOS gate 33 therebetween, and that the control gate channel region forms, together with the MOS gate channel region, a substantially rectangular channel region.

Gain coefficient β of the A-MOS device can be controlled according to voltage, by controlling the resistance value of the control gate channel according to the voltage level on control gate 35 to modulate the direction of an electric field applied to the MOS gate channel (between the source and drain) and thus change the substantial gate length and gate width.

Figure 4:
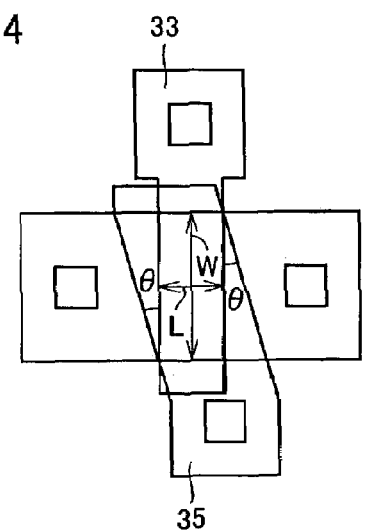
FIG. 4 shows device parameters of the MOS transistor with variable gain coefficient $\beta$.

The modulation characteristics of gain coefficient β of the A-MOS device are determined by parameters of the device shape as shown in FIG. 4, specifically by gate length L and gate width W of normal MOS gate 33, angle θ formed between normal MOS gate 33 and control gate 35 and the ratio of conductance between the control gate channel and the MOS gate channel.

Figure 5A:
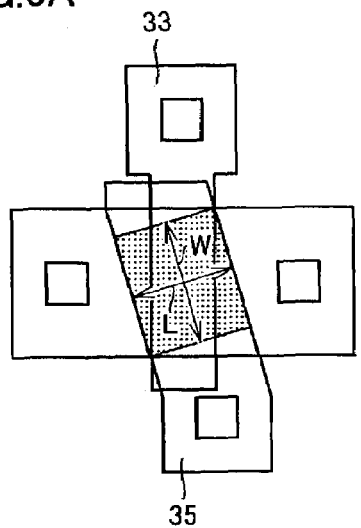
FIGS. 5A and 5B illustrate a principle of $\beta$ modulation for the MOS transistor with variable gain coefficient $\beta$.
Figure 5B:
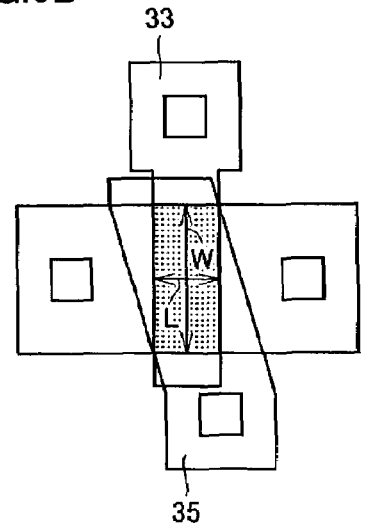

FIGS. 5A and 5B show a principle of the β modulation for the A-MOS device. In FIG. 5A, the conductance of the control gate channel is made equal to the conductance of the MOS gate channel, and the hatching portion represents an effective gate region (effective gate length L, effective gate width W) in this case. In FIG. 5B, the conductance of the control gate channel is made sufficiently larger than the conductance of the MOS gate channel, and the hatching portion represents an effective gate region (effective gate length L, effective gate width W) in this case. In this way, gain coefficient β of the A-MOS device can be modulated in analogue manner by changing the voltage on control gate 35 to change effective gate width W and effective gate length L.

An exemplary configuration of the logic circuit according to the present invention is described below.

Figure 6:
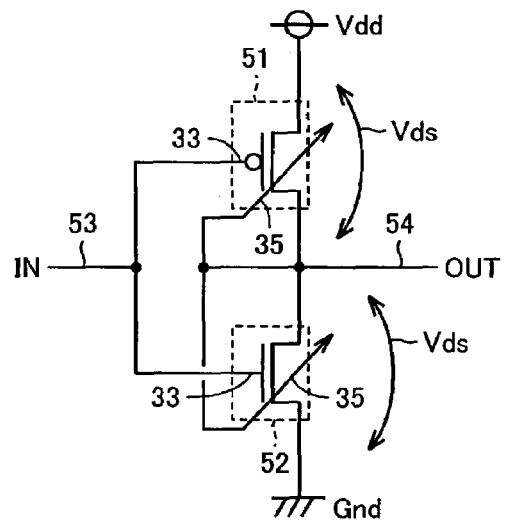
FIG. 6 is a circuit diagram showing a first exemplary configuration of a logic circuit according to the present invention.

Referring to FIG. 6, an inverter circuit 50 shown as a first example of the logic circuit according to the present invention includes a p-channel A-MOS transistor 51 and an n-channel A-MOS transistor 52. P-channel A-MOS transistor 51 is electrically connected between a power supply voltage Vdd and an output node 54 from which an output signal OUT is provided, and n-channel A-MOS transistor 52 is electrically connected between a ground voltage Gnd and output node 54. Respective gates 33 of p-channel A-MOS transistor 51 and n-channel A-MOS transistor 52 are connected to an input node 53 to which an input signal IN is transmitted. Supply voltage Vdd and ground voltage Gnd correspond respectively to H level and L level for the logic circuit.

As p-channel A-MOS transistor 51 and n-channel A-MOS transistor 52 each have a control gate 35 connected to output node 54, the transistors exhibit a feature that gain coefficient β increases with increase of the source-drain voltage Vds.

Figure 7:
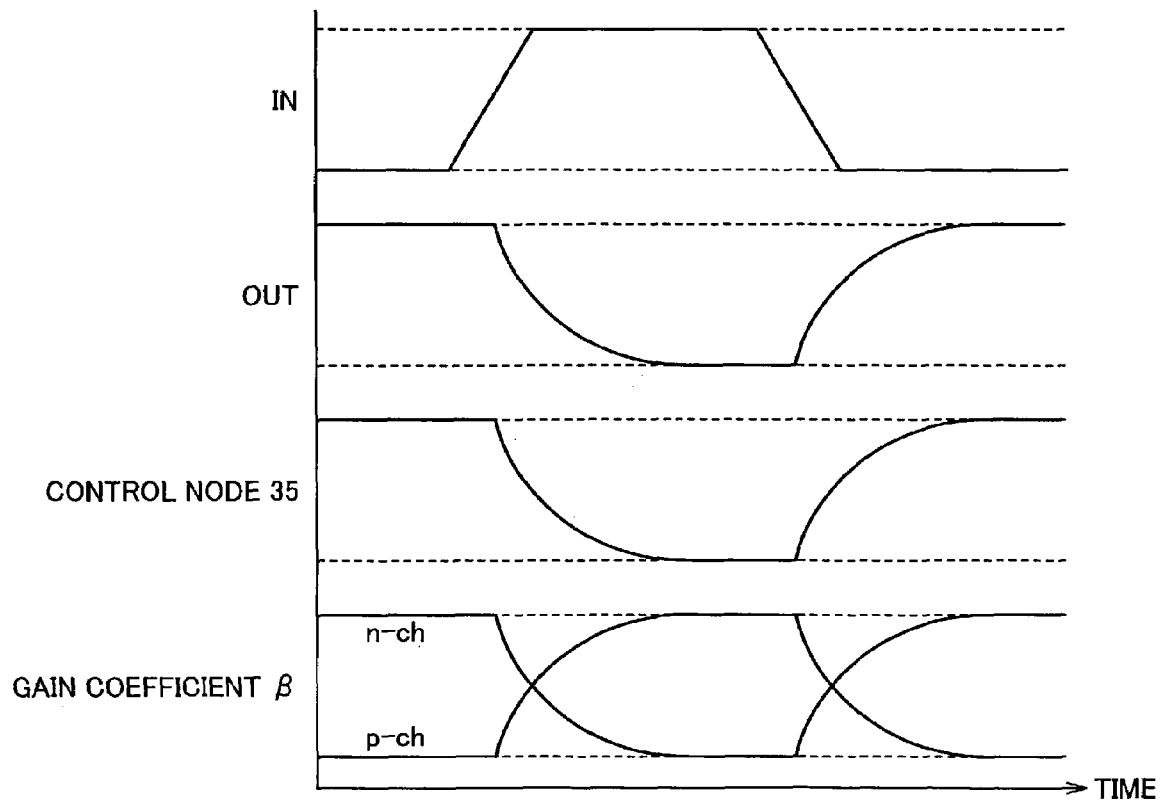
FIG. 7 illustrates an operation of an inverter circuit shown in FIG. 6.

FIG. 7 shows changes of signal levels on respective nodes in the inverter circuit shown in FIG. 6 and of gain coefficient β of A-MOS transistors 51 and 52 each, with respect to time. On output node 54, output signal OUT appears that is the inverted version of input signal IN, after a delay time determined by the load capacitance and the drive ability of the transistor. The voltage level on each of control gates 35 of respective A-MOS transistors that is connected to the output node 54 is the same as that of output signal OUT. Accordingly, gain coefficient β of each A-MOS transistor can be modulated in proportion to voltage Vds between the source and drain (output node 54) of each transistor. It is supposed here that gain coefficient β and Vds have a linear proportional relation therebetween, however, this relation may be nonlinear.

The circuit configuration of the present invention makes it possible to automatically change the ON resistance of the load-driving transistor according to the voltage of the output signal. Specifically, in the initial stage for changing the voltage of the output signal, gain coefficient β is increased (ON resistance is decreased) in a period in which the output voltage does not change to a sufficient degree. Then, when the output signal changes to a sufficient degree, gain coefficient β is decreased (ON resistance is increased). By such an automatic modulation of the ON resistance of the drive transistor according to the output voltage, fast signal change is achieved simultaneously with achievement of an effect of lessening the oscillation phenomenon resultant from the fast signal change.

Figure 8:
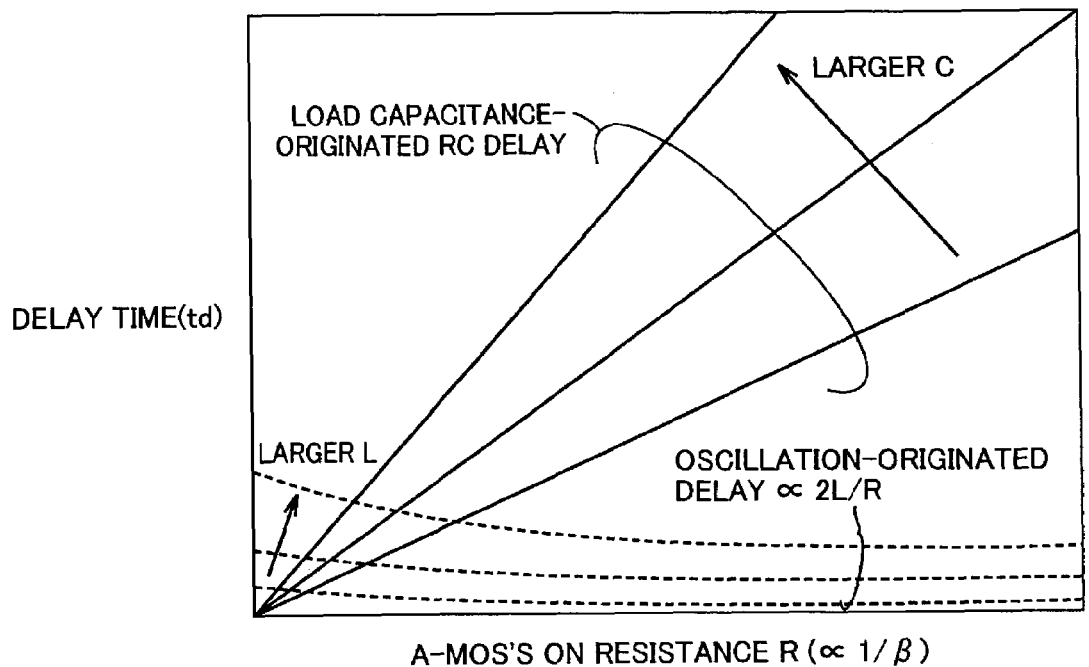
FIG. 8 shows delay characteristics with respect to a gain coefficient of the inverter circuit shown in FIG. 6.
Figure 9:
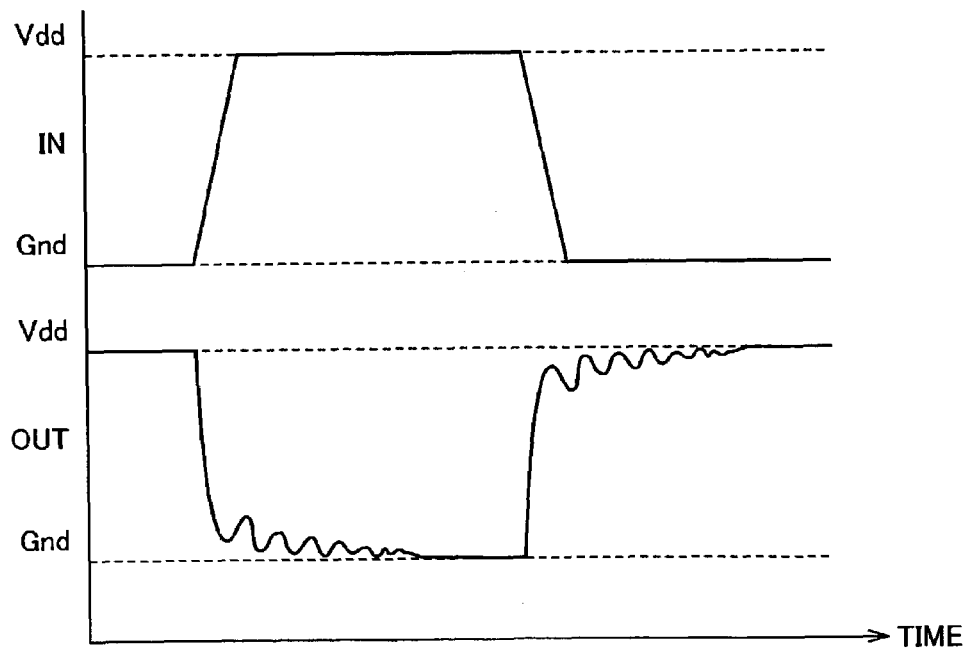
FIG. 9 is a waveform chart exemplarily showing input/output signals of the inverter circuit shown in FIG. 6.

FIG. 8 exemplarily shows characteristics of the delay time with respect to the ON resistance of the transistor (A-MOS)

in the inverter circuit of the present invention. In FIG. 8, the delay time determined by the RC time constant depending on the load capacitance corresponds to the state in which the drive transistor has a low ON resistance, and this delay time is almost the same as that of the conventional circuit. On the other hand, the delay time determined by time constant τ=2L/R caused by the oscillation is decreased by increasing the ON resistance according to the output signal. Thus, regarding the inverter circuit according to the present invention, the input/output signals as shown in FIG. 9 can be obtained.

Figure 10:
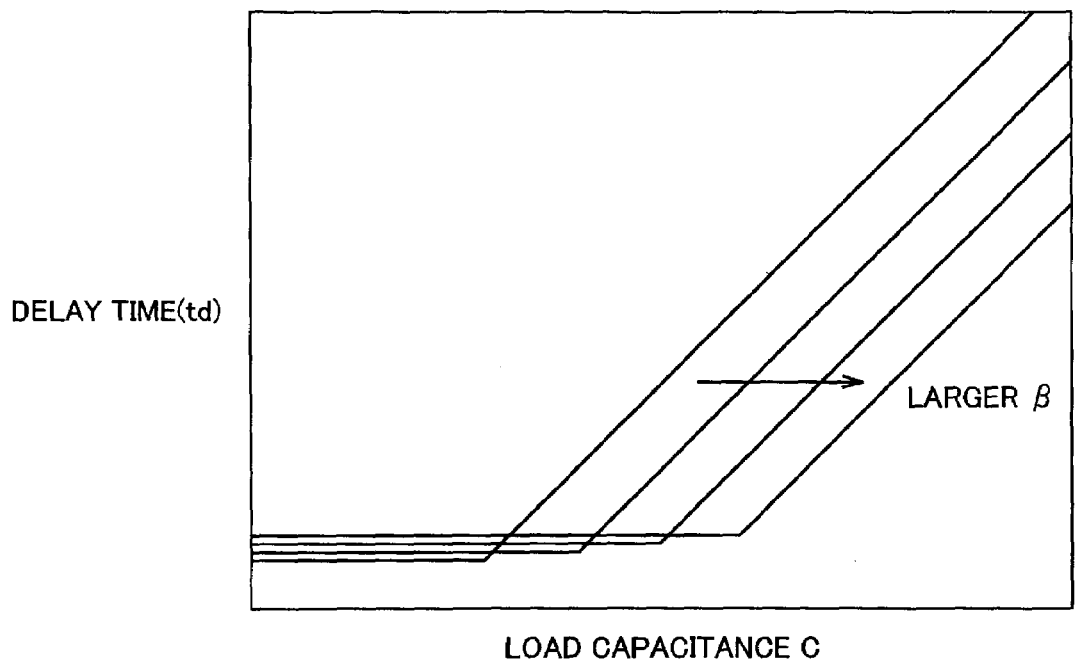
FIG. 10 shows delay characteristics with respect to a load capacitance of the inverter circuit shown in FIG. 6.
Figure 16:
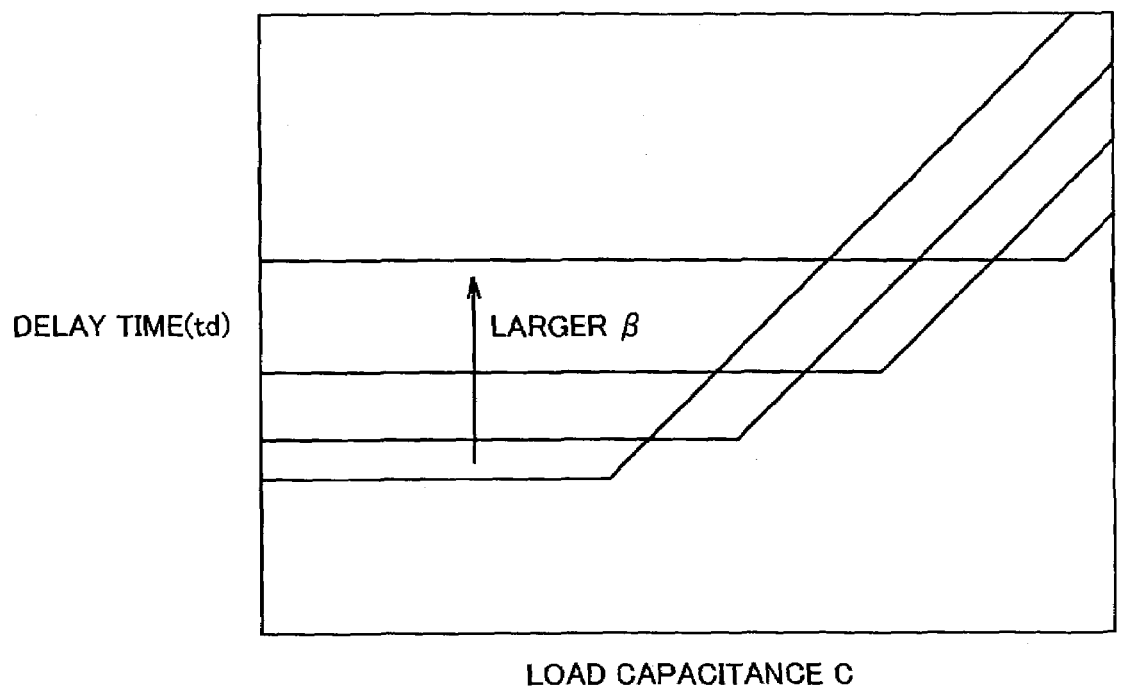
FIG. 16 shows delay characteristics with respect to a load capacitance in the conventional inverter circuit.

Based on the above-discussed operational principle of the inverter circuit according to the present invention, a relation between the load capacitance C and the gate delay time in consideration of the inductance L of the interconnection is shown in FIG. 10, using the transistor size (magnitude of β) as a parameter. It is seen from FIG. 10 that the delay time shows little change with respect to a certain load capacitance or smaller, regardless of the transistor size, as compared with the delay time characteristics of the conventional inverter circuit shown in similar manner in FIG. 16. Specifically, the delay of the conventional circuit that is caused by the oscillation sharply increases as the transistor size is increased, while the circuit configuration of the present invention provides an effect of remarkably suppressing increase of the delay caused by the oscillation. Through this effect, the present invention achieves an appropriate delay time by merely estimating the maximum assumed load capacitance and then determining the transistor size. This means that adjustment of the transistor size with respect to a considerable variation in load capacitance is unnecessary, and such troublesome problems as degradation in performance due to the variation in load capacitance occurring because of variations in manufacture as well as accurate estimation of the load capacitance for a complicated circuit configuration are avoided.

In the inverter circuit of the present invention, current flowing through a transistor which is to be turned off is reduced by the β modulation in proportion to Vds of the transistor. Specifically, when the input signal has H level, the gate length L of the n-channel A-MOS transistor is substantially increased while β is decreased. Consequently, when the input signal changes from H level to L level, any current flowing through the n-channel A-MOS transistor is reduced in the period in which the output changes from L level to H level. Moreover, when the input signal has L level, the effective gate length L of the p-channel A-MOS transistor is increased while β thereof is decreased. Thus, when the input signal changes from L level to H level, any current flowing through the p-channel A-MOS transistor is reduced in the period in which the output changes from H level to L level. In this way, by the logic circuit configuration of the present invention with the A-MOS transistors, the through current which is a problem for a fast operation is reduced thus the power consumption of the LSI is reduced.

Figure 11:
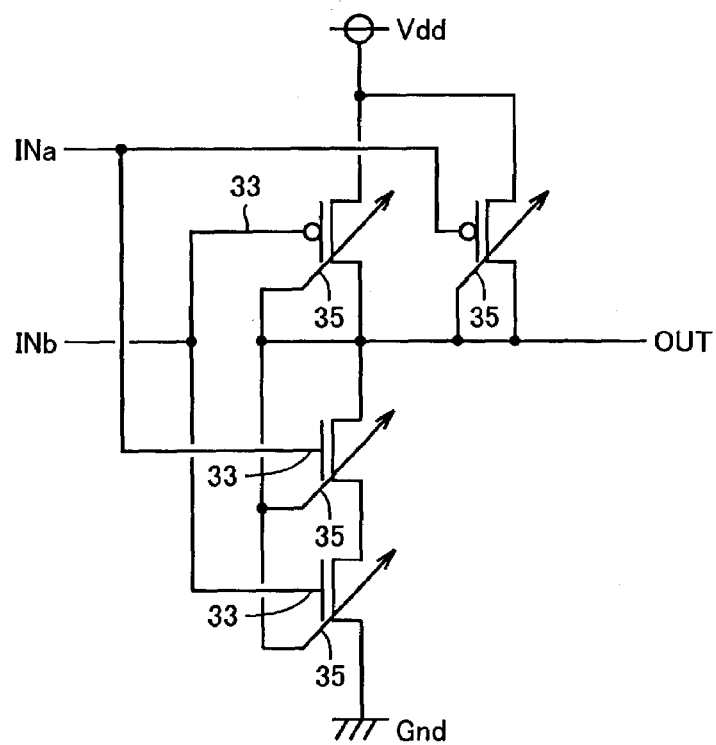
FIGS. 11 and 12 are circuit diagrams respectively showing second and third exemplary configurations of the logic circuit according to the present invention.
Figure 12:
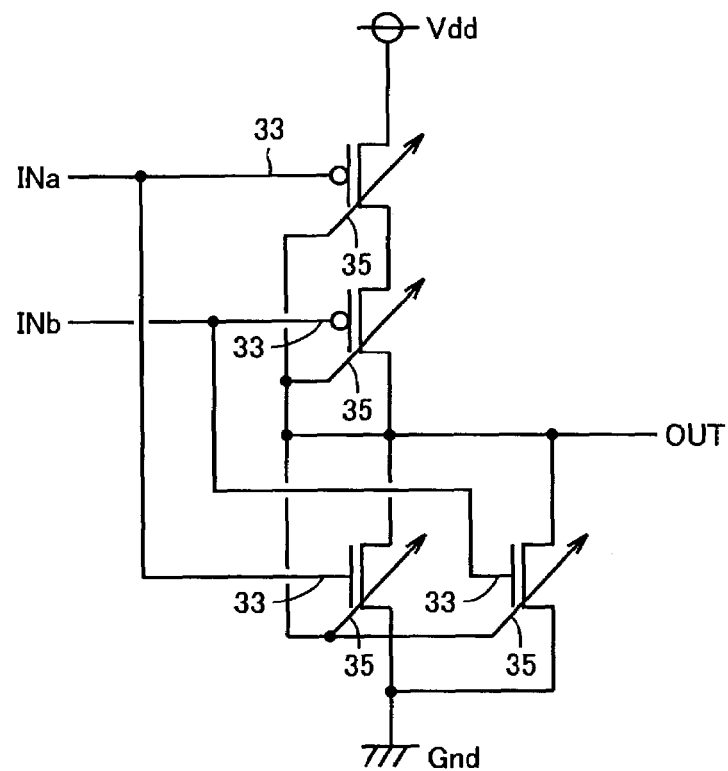
Figure 13:
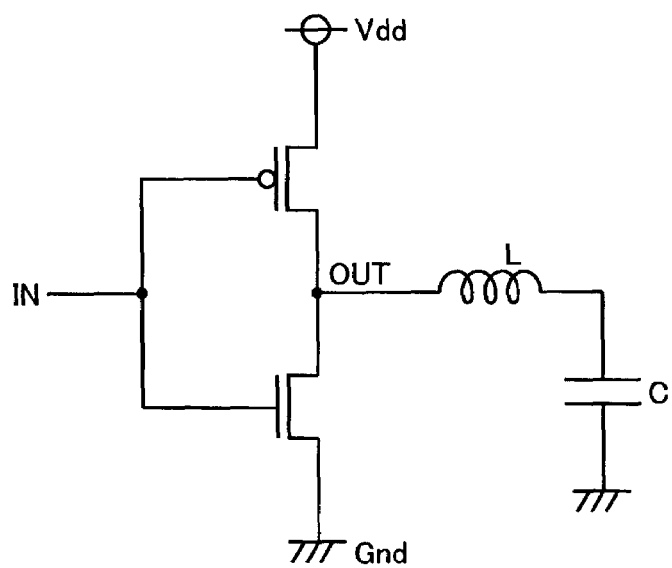
FIG. 13 exemplarily shows a general circuit configuration of a conventional inverter.
Figure 14:
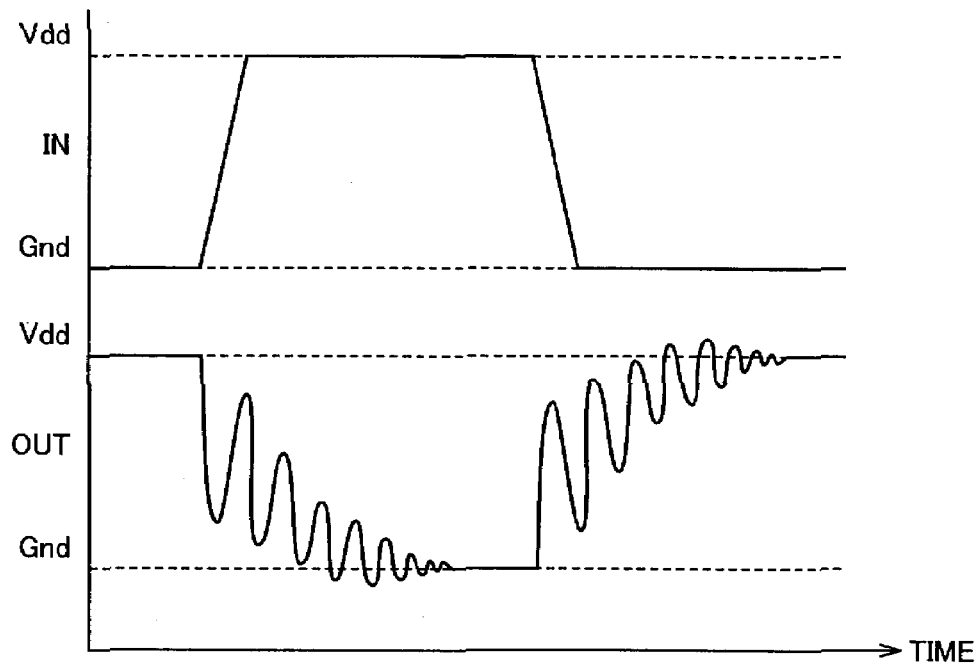
FIG. 14 is a waveform chart exemplarily showing input/output signals of the conventional inverter circuit.
Figure 15:
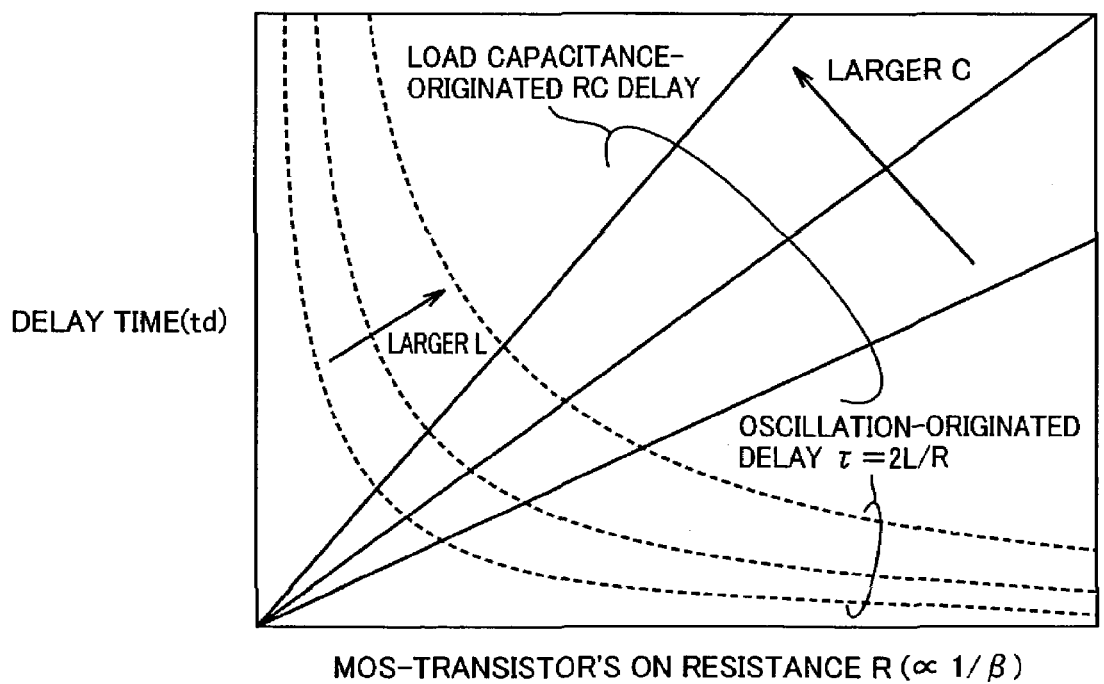
FIG. 15 shows delay characteristics with respect to a gain coefficient of the conventional inverter circuit.

The logic circuit according to the present invention is not limited to the inverter circuit but applicable to various types of conventional logic circuits. FIGS. 11 and 12 respectively show exemplary configurations of a NAND logic circuit 60 and a NOR circuit 70. NAND logic circuit 60 and NOR circuit 70 are each configured as a CMOS logic circuit including p-channel and n-channel A-MOS devices, and each A-MOS device has its gate 33 to which an input signal INa or INb is transmitted and has its control gate 35 connected to the output node.

An AND circuit and an OR circuit may similarly be configured (not shown). In these logic circuits, an input signal is not necessarily transmitted directly to the gate of each A-MOS device and, some A-MOS devices each may have the gate to which a signal according to an input signal is supplied.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising a semiconductor logic circuit, said semiconductor logic circuit including a semiconductor device having a gain coefficient which is electrically modulatable in a continuously variable manner, wherein
    said semiconductor device is a field-effect transistor, and the gain coefficient of said field-effect transistor is modulated according to a voltage between the source and drain of said field-effect transistor.

2. semiconductor integrated circuit device comprising a semiconductor logic circuit, said semiconductor logic circuit including a semiconductor device having a gain coefficient which is electrically modulatable in a continuously variable manner, wherein
    said semiconductor device is a field-effect transistor, and the gain coefficient of said field-effect transistor decreases with decrease of a voltage between the source and drain of said field-effect transistor.

3. semiconductor integrated circuit device comprising a semiconductor logic circuit, said semiconductor logic circuit including a semiconductor device having a gain coefficient which is electrically modulatable in a continuously variable manner, wherein
    said semiconductor device has a p-type MOS device with modulatable gain coefficient and an n-type MOS device with modulatable gain coefficient, and
    at least one of said p-type MOS device with modulatable gain coefficient and said n-type MOS device with modulatable gain coefficient has its control gate connected to an output node of said semiconductor logic circuit.

4. A semiconductor integrated circuit device comprising a logic circuit providing, according to a result of a predetermined logical operation performed on an input which is at least one signal having one of a first level and a second level, one of said first level and said second level, to an output node,
    said logic circuit including a first field-effect transistor having a gain coefficient electrically modulatable in analogue manner, and
    said first field-effect transistor having a gate electrically connected between a first voltage corresponding to said first level and said output node and receiving one of (i) one of said at least one signal and (ii) a signal according to said at least one signal, transmitted to said gate.

5. The semiconductor integrated circuit device according to claim 4, wherein
    the gain coefficient of said first field-effect transistor changes according to a voltage between the source and drain of said first field-effect transistor.

6. The semiconductor integrated circuit device according to claim 5, wherein
    the gain coefficient of said first field-effect transistor decreases with decrease of said voltage between the source and drain.

7. The semiconductor integrated circuit device according to claim 4, wherein
said first field-effect transistor further has a control gate electrically connected to said output node, and
the gain coefficient of said first field-effect transistor continuously changes according to a voltage applied to said control gate.

8. The semiconductor integrated circuit device according to claim 4, wherein
said logic circuit further includes a second field-effect transistor having a gain coefficient electrically modulatable in analogue manner and having a conductivity type opposite to that of said first field-effect transistor, and
said second field-effect transistor further has a gate electrically connected between a second voltage corresponding to said second level and said output node and receiving one of (i) one of said at least one signal and (ii) a signal according to said at least one signal, transmitted to said gate.

9. The semiconductor integrated circuit device according to claim 8, wherein
said first and second field-effect transistors each further has a control gate,
respective gain coefficients of said first and second field-effect transistors continuously change according to voltages respectively applied to respective control gates of said first and second field-effect transistors, and
at least one of respective control gates of said first and second field-effect transistors is electrically connected to said output node.

10. A semiconductor integrated circuit device comprising a semiconductor logic circuit, said semiconductor logic circuit including a semiconductor device having a gain coefficient which is electrically modulatable in analogue manner,
wherein said semiconductor device is a field-effect transistor, and
the gain coefficient of said field-effect transistor is modulated according to a voltage between the source and drain of said field-effect transistor.

11. The semiconductor integrated circuit device according to claim 10, wherein
the gain coefficient of said field-effect transistor decreases with decrease of a voltage between the source and drain of said field-effect transistor.

12. The semiconductor integrated circuit device according to claim 10, wherein
said semiconductor device has a p-type MOS device with modulatable gain coefficient and an n-type MOS device with modulatable gain coefficient, and
at least one of said p-type MOS device with modulatable gain coefficient and said n-type MOS device with modulatable gain coefficient has its control gate connected to an output node of said semiconductor logic circuit.

* * * * *

UNITED STATES PATENT AND TRADEMARK OFFICE
CERTIFICATE OF CORRECTION

PATENT NO.     : 6,972,591 B2                                              Page 1 of 1
DATED          : December 6, 2005
INVENTOR(S)    : Yutaka Arima It is certified that error appears in the above-identified patent and that said Letters Patent is hereby corrected as shown below:

Column 8,
Lines 21 and 30, before "semiconductor integrated" insert -- A --.

Signed and Sealed this

Twenty-eighth Day of March, 2006

JON W. DUDAS
*Director of the United States Patent and Trademark Office*